(12) United States Patent
Elkin et al.

(10) Patent No.: US 10,931,266 B2
(45) Date of Patent: Feb. 23, 2021

(54) LOW POWER FLIP-FLOP ELEMENT WITH GATED CLOCK

(71) Applicant: NVIDIA CORPORATION, Santa Clara, CA (US)

(72) Inventors: Ilyas Elkin, Sunnyvale, CA (US); Ge Yang, Dublin, CA (US); Xi Zhang, San Jose, CA (US); Jiani Yu, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 560 days.

(21) Appl. No.: 14/456,805

(22) Filed: Aug. 11, 2014

(65) Prior Publication Data

US 2016/0043706 A1 Feb. 11, 2016

(51) Int. Cl.
*H03K 3/3562* (2006.01)
*H03K 3/012* (2006.01)
*H03K 3/037* (2006.01)

(52) U.S. Cl.
CPC ......... *H03K 3/35625* (2013.01); *H03K 3/012* (2013.01); *H03K 3/0372* (2013.01)

(58) Field of Classification Search
CPC ...... H03K 3/012; H03K 3/037; H03K 3/0372; H03K 3/356; H03K 3/3562; H03K 3/35625

See application file for complete search history.

(56) References Cited

U.S. PATENT DOCUMENTS

| | | | |
|---|---|---|---|
| 6,356,132 B1 * | 3/2002 | Mastrocola | H03K 5/131 327/269 |
| 8,890,573 B2 | 11/2014 | Elkin et al. | |
| 9,071,233 B2 | 6/2015 | Elkin et al. | |
| 9,124,261 B2 * | 9/2015 | Kim | H03K 3/356173 |
| 9,306,545 B2 * | 4/2016 | Baratam | H03K 3/012 |
| 9,331,680 B2 * | 5/2016 | Gurumurthy | H03K 3/35625 |
| 9,350,325 B2 * | 5/2016 | Cai | H03K 3/012 |
| 2012/0182056 A1 | 7/2012 | Dally et al. | |

* cited by examiner

*Primary Examiner* — Patrick O Neill

(74) *Attorney, Agent, or Firm* — Artegis Law Group, LLP

(57) ABSTRACT

A flip-flop element is configured to gate the clock inversions within a master-slave flip-flop element. The flip-flop element reduces the number of circuit elements within the flip-flop element by collapsing elements with common functionality into a single circuit element. Further, by making the actions of judiciously selected circuit elements conditional upon the state of the input data, the flip-flop element circuit reduces the number of internal transitions. In this manner, by reducing the number of circuit elements as well as the number of transitions, the flip-flop element achieves substantial reduction in overall system power consumption, resulting in a more efficient system.

22 Claims, 11 Drawing Sheets

LOW POWER FLIP-FLOP ELEMENT WITH GATED CLOCK

BACKGROUND OF THE INVENTION

1. Field of the Invention

Embodiments of the present invention relate generally to computer systems and, more specifically, to a low power flip-flop element with gated clock.

2. Description of the Related Art

In computer systems, there is widespread utilization of flip-flop elements. A flip-flop element, also known as a bi-stable multivibrator, is a circuit that has two stable states and may be used to store data. A periodic signal, known as a clock, is applied to one input of the flip-flop element in order to transfer the state of a second, data input signal to the output on the rising edge of the clock.

A typical flip-flop element is configured in a master-slave arrangement. An input latch, know as the master latch, couples the input data to a second latch, known as the slave latch, on the rising edge of the clock signal. The slave latch couples the data from the master latch to the output on the falling edge of the clock signal. The master latch and slave latch each generate multiple clock inversions to implement the data capture functionality.

A number of P-channel and N-channel metal-oxide-semiconductor (MOS) field effect transistors (FETs) are configured in a circuit arrangement to construct the flip-flop element. Within the circuit arrangement, some of the FETs are coupled in pairs, consisting of one PFET and one NFET, to form inverters. Inverters consume power during the switching intervals, and power consumption increases as the frequency of operation increases. Further, all FETs dissipate power due to charging and discharging of junction capacitances whenever a varying signal is applied.

During operation, in a conventional flip-flop element, clocking action is applied to a number of the FET junctions and inverters within the flip-flop element on each clock cycle. For example, if the data input is high, the flip-flop element clocks the high input level to the output. If, on the next cycle, the data input is low, the flip-flop element will clock the low input level to the output. Alternatively, if the data input has remained high, the flip-flop element will clock the high level input level to the output on the next cycle even though the output already had been set high on the prior cycle. Thus, all clocking action results in numerous junction transitions regardless of whether the input changes.

Each clocking action in each individual FET causes dissipation, and the sum of these dissipations equals the dissipation of each individual flip-flop element. The sum of the dissipations of all flip-flop elements represents a portion of the system usage that may exceed twenty percent of the total power consumption.

One drawback to the above approach is that clocking of flip-flop elements incurs power dissipation on each clock cycle regardless of the state of the input data. In a computer system, over a long period, the number of ones and zeroes may be expected to be generally equivalent. Computer data carries information, but a simple alternating sequence of ones and zeroes, such as a clock signal, carries no information. Consequently, consecutive bit sequences during which the logic state remains unchanged must occur in the data signal. In such sequences, it is necessary to capture the first bit only, as the output is unchanged for subsequent bits. Thus, the power consumption due to internal clocking of flip-flop elements is generally avoidable and represents excessive usage.

As the foregoing illustrates, what is needed in the art is a more effective technique for reducing the power dissipated by a flip-flop element.

SUMMARY OF THE INVENTION

One embodiment of the present invention sets forth a circuit element configured to perform a data capture operation, including a first latch element configured to receive a first data signal that has a first logic state, invert the first logic state to generate a first inverted logic state, receive a first clock signal, and invert the first clock signal to generate a first inverted clock signal. The circuit element further includes a first logic element coupled to the first latch element and configured to gate the first inverted clock signal with the first inverted logic state to generate a second clock signal, and output the second clock signal to the first latch element, where the first latch element, in response to the second clock signal, inverts the first data signal to generate a first inverted data signal.

One advantage of the disclosed approach is that gating the clock inversion according to the state of the input data substantially reduces the number of transitions that the constituent FETs and inverters undergo, which results in less overall power consumption. Further, combining functionality of constituent FETs reduces the number of constituent FETs and, hence, reduces the number of overall transitions in the circuit, which further reduces power consumption.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
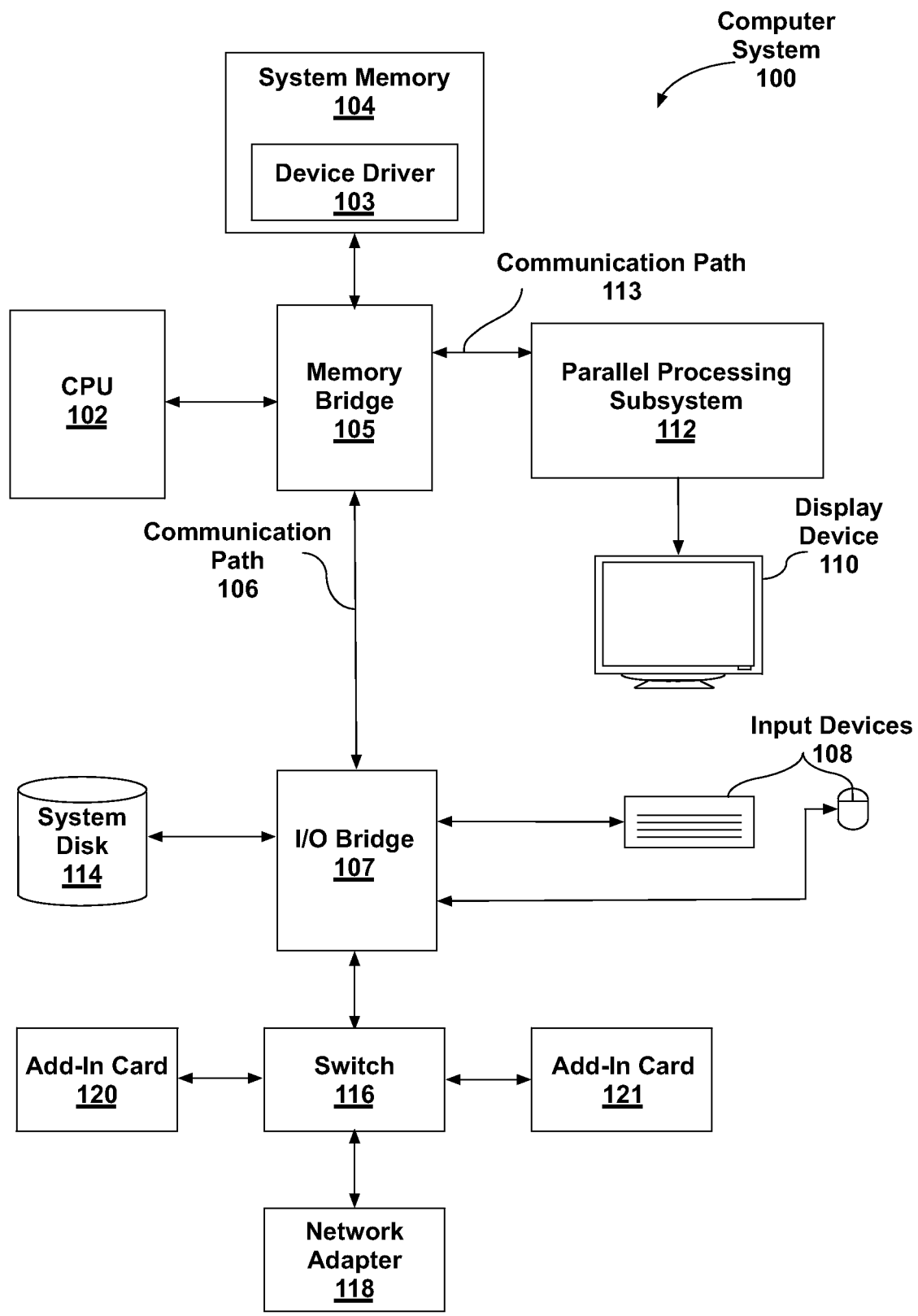
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
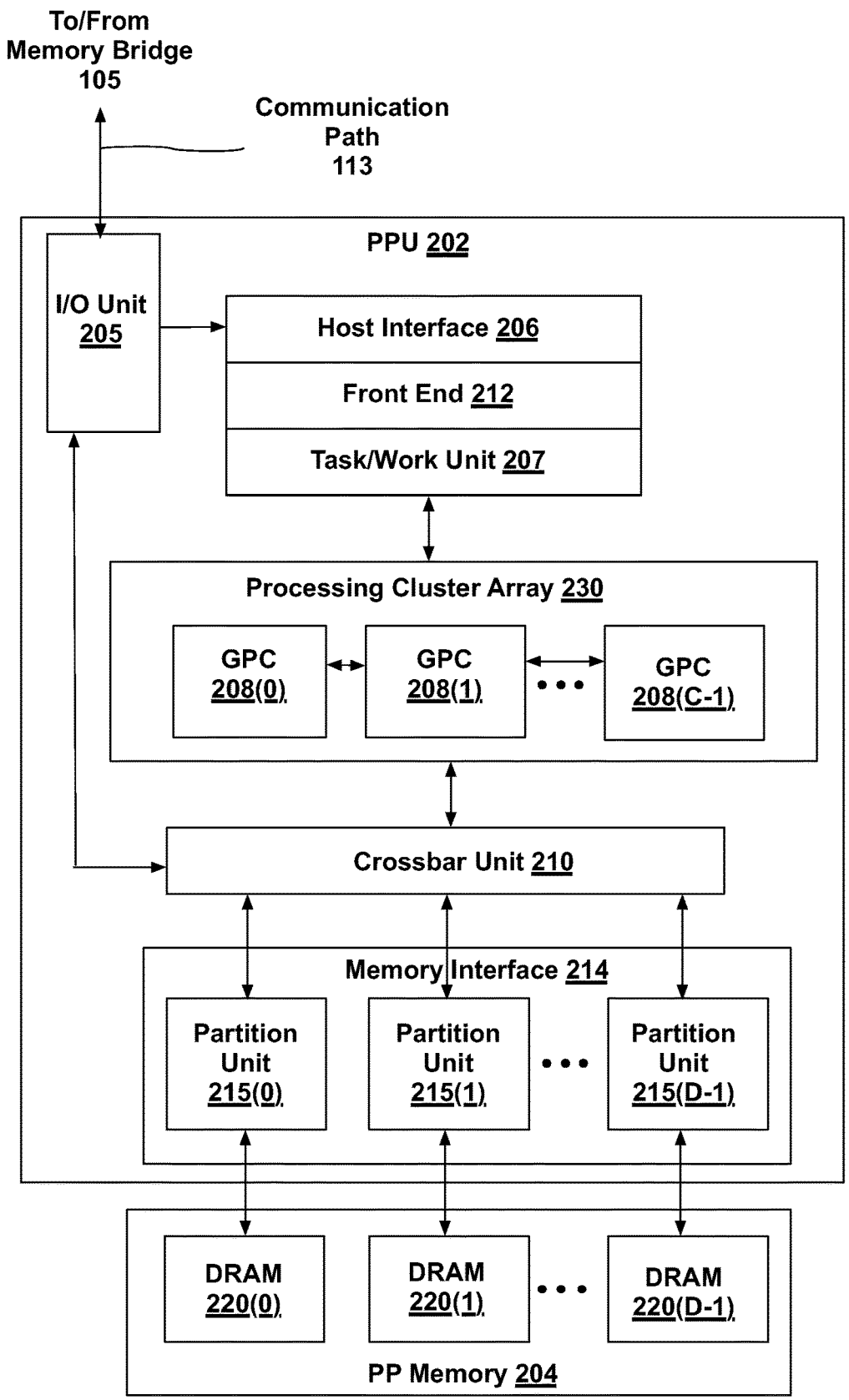
FIG. 2 is a block diagram of a parallel processing unit included in the parallel processing subsystem of FIG. 1, according to one embodiment of the present invention.

FIG. 2 is a block diagram of a parallel processing unit (PPU) 202 included in the parallel processing subsystem 112 of FIG. 1, according to one embodiment of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3:
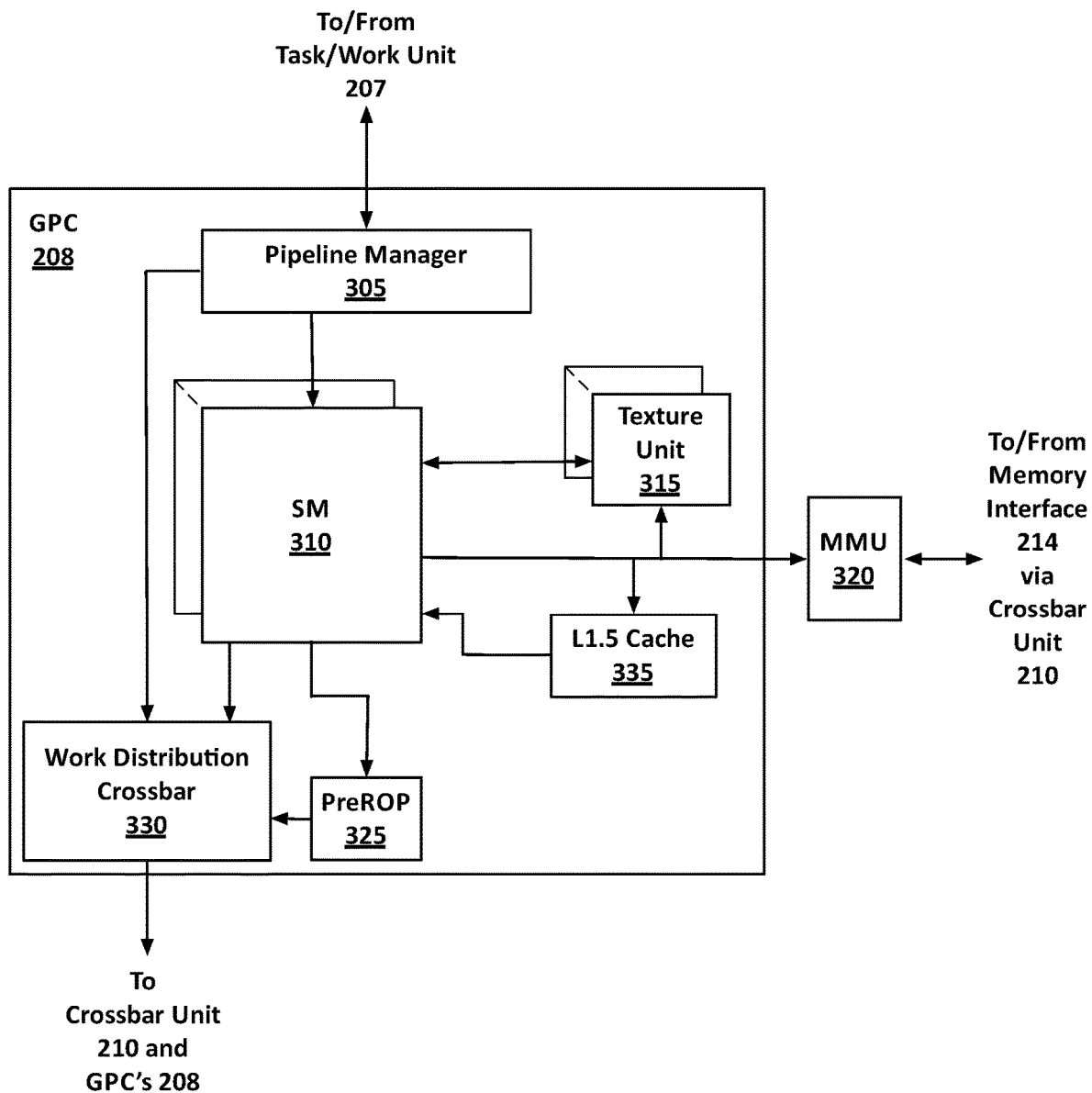
FIG. 3 is a block diagram of a general processing cluster included in the parallel processing unit of FIG. 2, according to one embodiment of the present invention.

FIG. 3 is a block diagram of a GPC 208 included in PPU 202 of FIG. 2, according to one embodiment of the present invention. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3, each SM 310 contains a level one (L1) cache or uses space in a corresponding L1 cache outside of the SM 310 to support, among other things, load and store operations performed by the execution units. Each SM 310 also has access to level two (L2) caches (not shown) that are shared among all GPCs 208 in PPU 202. The L2 caches may be used to transfer data between threads. Finally, SMs 310 also have access to off-chip "global" memory, which may include PP memory 204 and/or system memory 104. It is to be understood that any memory external to PPU 202 may be used as global memory. Additionally, as shown in FIG. 3, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in an L2 cache (not shown), parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processing units, such as SMs 310, texture units 315, or preROP units 325, may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-3 in no way limits the scope of the present invention.

Low Power Flip-Flop Element with Gated Clock

Figure 4:
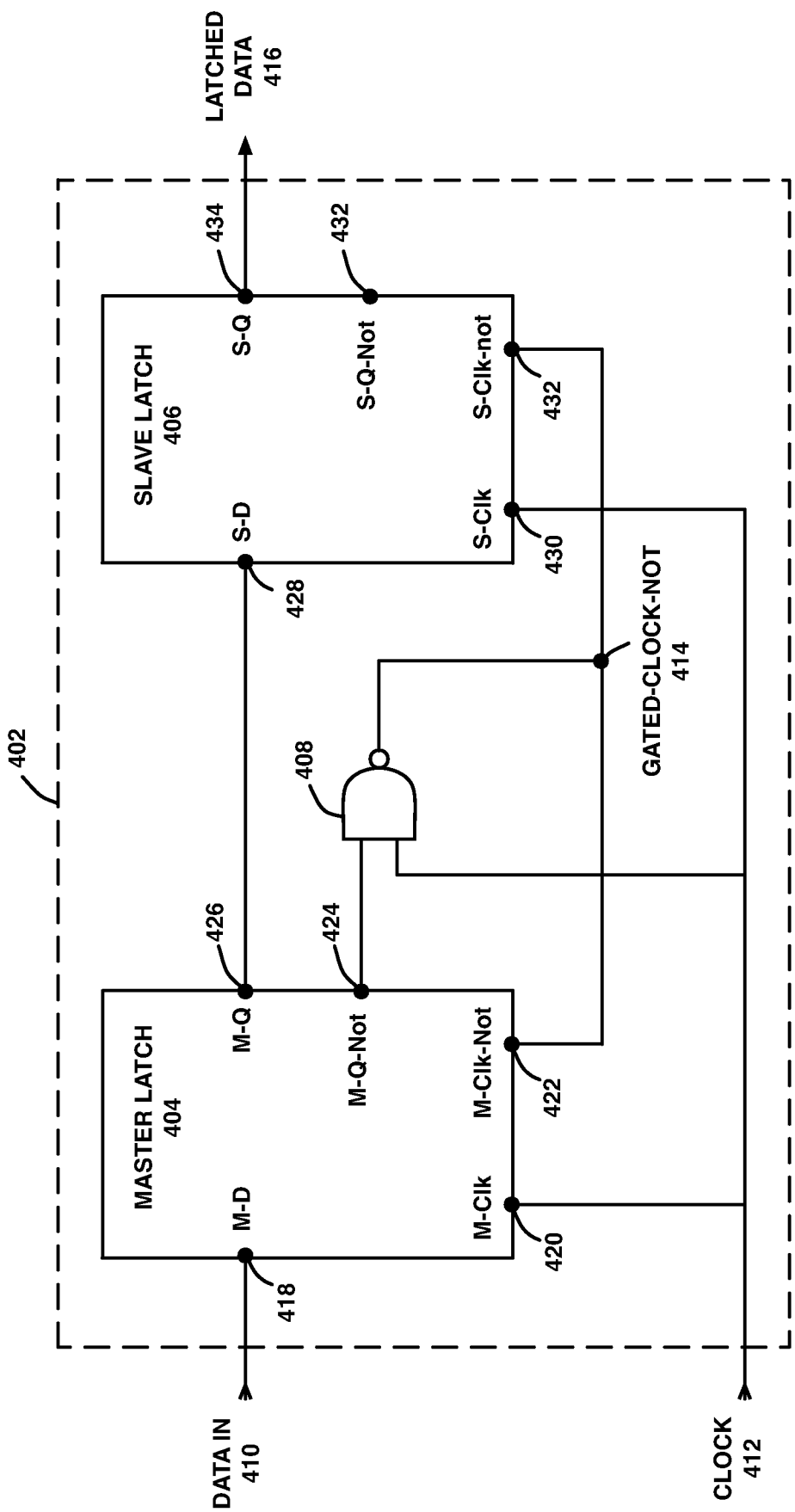
FIG. 4 is a conceptual diagram of a flip-flop element that includes a gated clock, according to one embodiment of the present invention.

FIG. 4 is a conceptual diagram of a flip-flop element 402 that includes a gated clock, according to one embodiment of the present invention. Flip-flop element 402 may be included within any portion of computer system 100 of FIG. 1 that is configured to capture data to perform operations. For example, CPU 102 of FIG. 1 or PPU 202 of FIG. 2 may include one or more instances of flip-flop element 402. As a general matter, flip-flop element 402 may be incorporated into any type of computer device, including server machines, desktop machines, laptop computers, mobile devices, handheld devices, and so forth.

As shown, flip-flop element 402 includes master latch 404, slave latch 406, and NAND gate 408. Flip-flop element 402 couples clock 412 to M-Clk 420, the clock input of master latch 404, to S-Clk 430, the clock input of slave latch 406, and to one input of NAND gate 408.

Flip-flop element 402, further, couples data in 410 to M-D 418, the data input port of master latch 404. Master latch 404 produces the state of data in 410 at the output port, M-Q 426, on the rising edge of clock 412. Master latch 404 couples the state of data in 410 to S-D 428, the data input port of slave latch 406. Master latch 404, then, couples the inversion of the state of data in 410, at M-Q-not 424, to the second input of NAND gate 408. When M-Q-not 424 is low, the output of NAND gate 408 is gated high.

NAND gate 408 produces an inversion of clock 412 only when m-q-not 424 is high. Thus, gated-clock-not 414 is an inversion of clock 412 that is gated according to the state of data in 410. Gated-clock-not 414 is, then, coupled to M-Clk-not 422, the inverted clock input of master latch 404, and to S-Clk-not 432, the inverted clock input of slave latch 406. Slave latch 406 forwards the state of the S-D 428 input to the S-Q 434 output to produce latched data 416.

In this manner, all clock inversion transitions within master latch 404 and slave latch 406 are controlled by gated-clock-not 414. When gated-clock-not 414 is at a high logic level, the high input to NAND gate 408 enables NAND gate 408 to produce the inversion of clock 412 at the output as gated-clock-not 414. All junctions coupled to gated-clock-not 414, then, transition between the high and low level with each cycle of clock 412. However, when gated-clock-not 414 is at a low logic level, the low input to NAND gate 408 forces the output of NAND gate 408 to a steady high state, and all transitions of gated-clock-not 414 cease. All junctions coupled to gated-clock-not 414 will, then, be in an idle state. Thus, the number of transitions and the consequent power penalty associated with the inverted clock may be reduced, as described above, by generally the proportionality of the two logic states. Consequently, a substantial reduction in system power usage may be realized.

Figure 5:
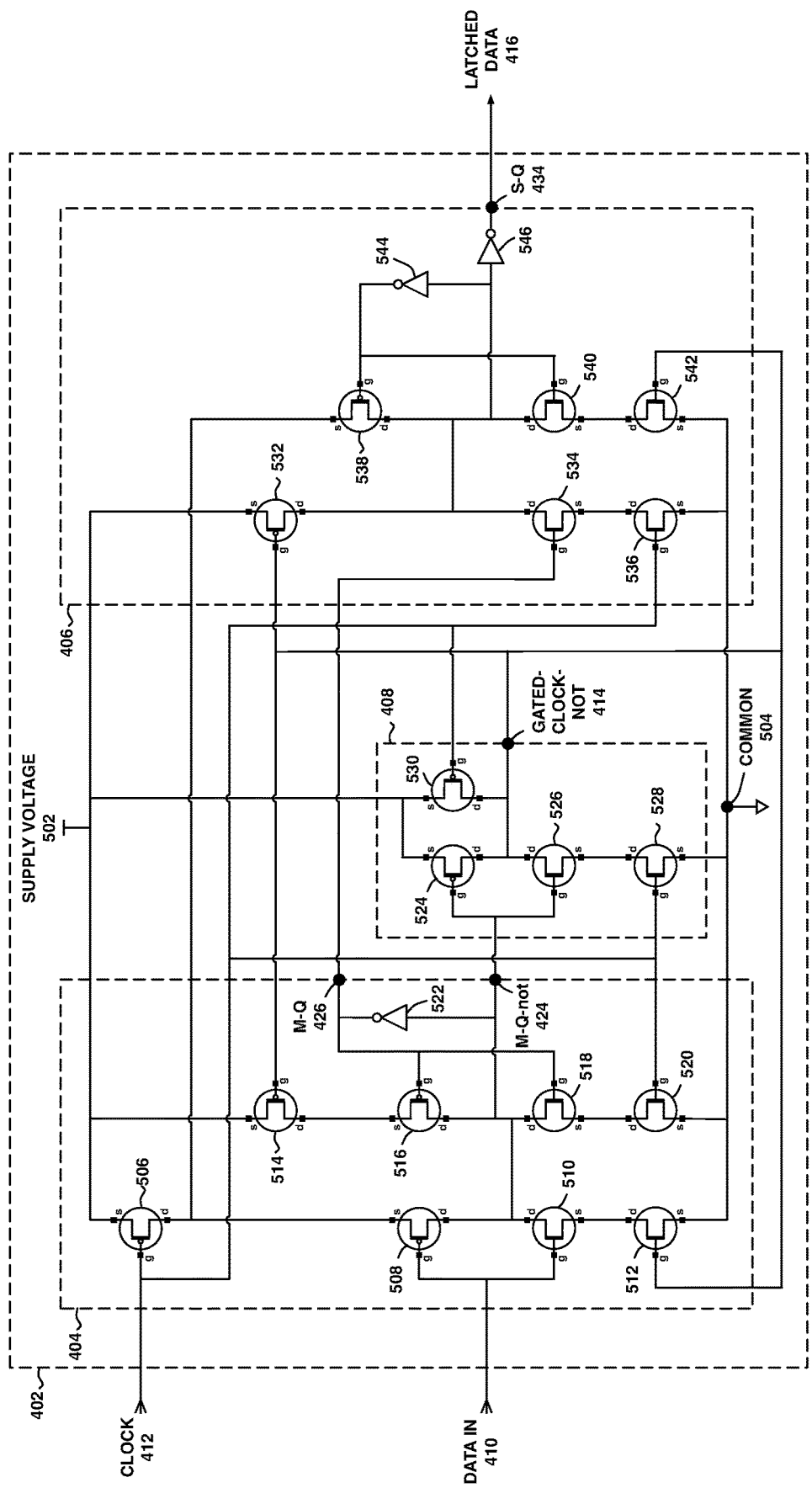
FIG. 5 is a more detailed illustration of the flip-flop element of FIG. 4, according to one embodiment of the present invention.

FIG. 5 is a more detailed illustration of flip-flop element 402 of FIG. 4, according to one embodiment of the present invention. As shown, master latch 404 includes an input stack formed by PFETs 506 and 508, and NFETs 510 and 512. Master latch 404 further includes a keeper formed by PFETs 514 and 516, NFETs 518 and 520, and inverter 522. NAND gate 408 includes PFETs 524 and 530, and NFETs 526 and 528. Slave latch 406 includes an input stack formed by PFET 532 and NFETs 534 and 536, and a keeper formed by PFET 538, NFETs 540 and 542 and inverters 544 and 546.

Flip-flop element 402 couples data in 410 to the input stack of master latch 404. PFET 508 and NFET 510 constitute an inverter that is gated by clock 412, applied to PFET 506, and by gated-clock-not 414, applied to NFET 512. The input stack of master latch 404 couples inverted data to the keeper of master latch 404 as M-Q-not 424. Gated-clock-not 414 controls PFET 514, which gates the common 504 connection to PFET 516 and NFET 518. Similarly, clock 412 controls FET 520, which gates the supply voltage 502 connection to PFET 516 and NFET 518. Thus, master latch 404 retains the inversion of the state of data in 410.

Master latch 404 couples captured data inversion, M-Q-not 424, to one input of NAND gate 408. Flip-flop element 402 couples clock 412 to the second input of NAND gate 408. NAND gate 408, then, produces gated-clock-not 414 which is the gated inversion of clock 412.

Master latch 404, further, couples captured data, M-Q-26 to the data input of slave latch 406, NFET 534. Gated-clock-not 414 controls PFET 532, which gates the supply voltage 502 connection to NFET 534. Similarly, clock 412 controls NFET 536, which gates the common 504 connection to NFET 534.

The circuit topology of the input stack of slave latch 406 consists of a single FET in the inverter portion. The function of an upper FET of the inverter portion, analogous to PFET 508 in master latch 404, would be redundant with the implementation of the inversion clock via gated-clock-not 414. Further, in the keeper of slave latch 406, PFET 506, common to master latch 404 input stack, performs the functionality of the upper clocking FET, analogous to PFET 514 in master latch 404. Thus, slave latch 704 eliminates two FETs compared to conventional designs.

Eliminating two FETs reduces power usage in the flip-flop element. Further, the gating of the clock inversion achieved by NAND gate 408 allow substantial reduction in the number of junction transitions occurring on each clock cycle. Thus, the staticized flip-flop element affords substantial reduction in the power consumption.

Figure 6:
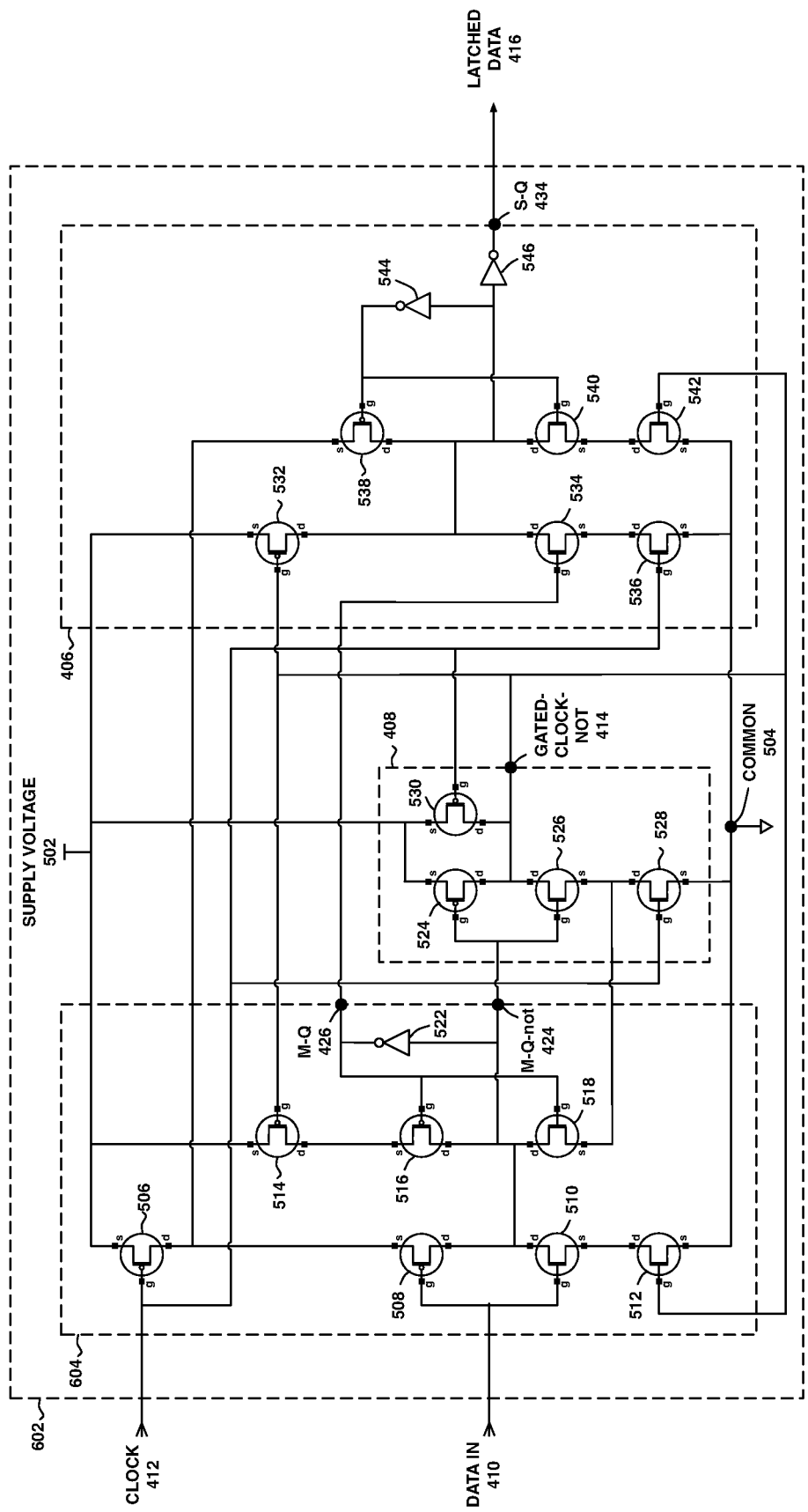
FIG. 6 is a conceptual diagram of a flip-flop element that includes a simplified master latch, according to one embodiment of the present invention.

FIG. 6 is a conceptual diagram of flip-flop element 602 that includes a simplified master latch 604, according to one embodiment of the present invention. Flip-flop element 602 includes some of the same elements as flip-flop element 402 described above in conjunction with FIGS. 4-5. However, certain elements have been removed in flip-flop element 602 compared to flip-flop element 402. In particular, master latch 604 does not include NFET 520, as is shown. Instead, master latch 604 utilizes NFET 528, within NAND gate 408, to implement the functionality of NFET 520. In this manner, flip-flop element 602 achieves further power reduction by reducing the number of constituent FETs.

Figure 7:
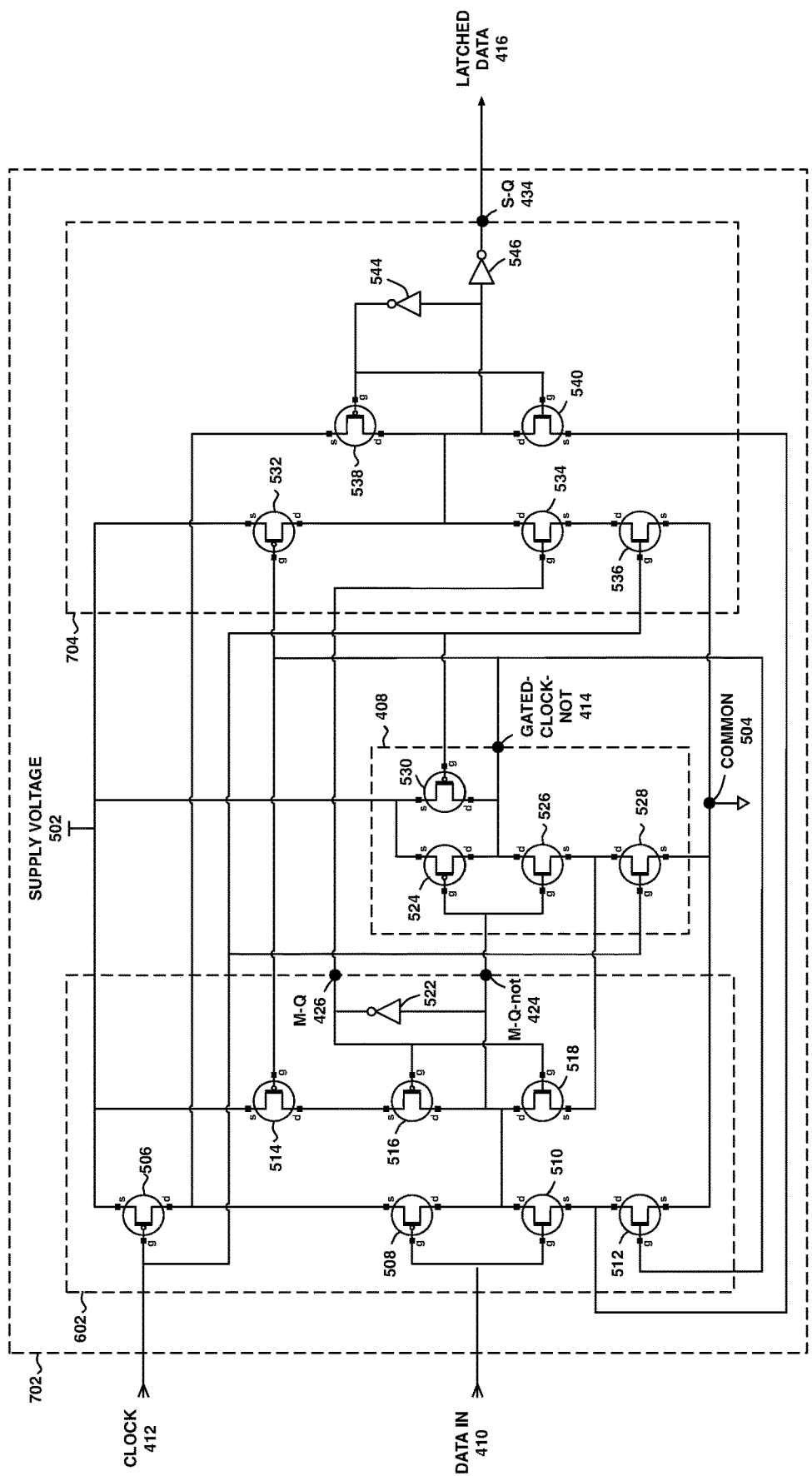
FIG. 7 is a conceptual diagram of a flip-flop element that includes a simplified slave latch, according to one embodiment of the present invention.

FIG. 7 is a conceptual diagram of a flip-flop element 702 that includes a simplified slave latch 704, according to one embodiment of the present invention. Flip-flop element 702 includes some of the same elements as flip-flop element 602 described above in conjunction with FIG. 6. However, certain elements have been removed in flip-flop element 702 compared to flip-flop element 602. In particular, slave latch 704 does not include NFET 542, as is shown. Instead, slave latch 704 utilizes NFET 512, within master latch 404, to implement the functionality of NFET 542. In this manner, flip-flop element 702 achieves further power reduction by further reducing the number of constituent FETs.

Figure 8:
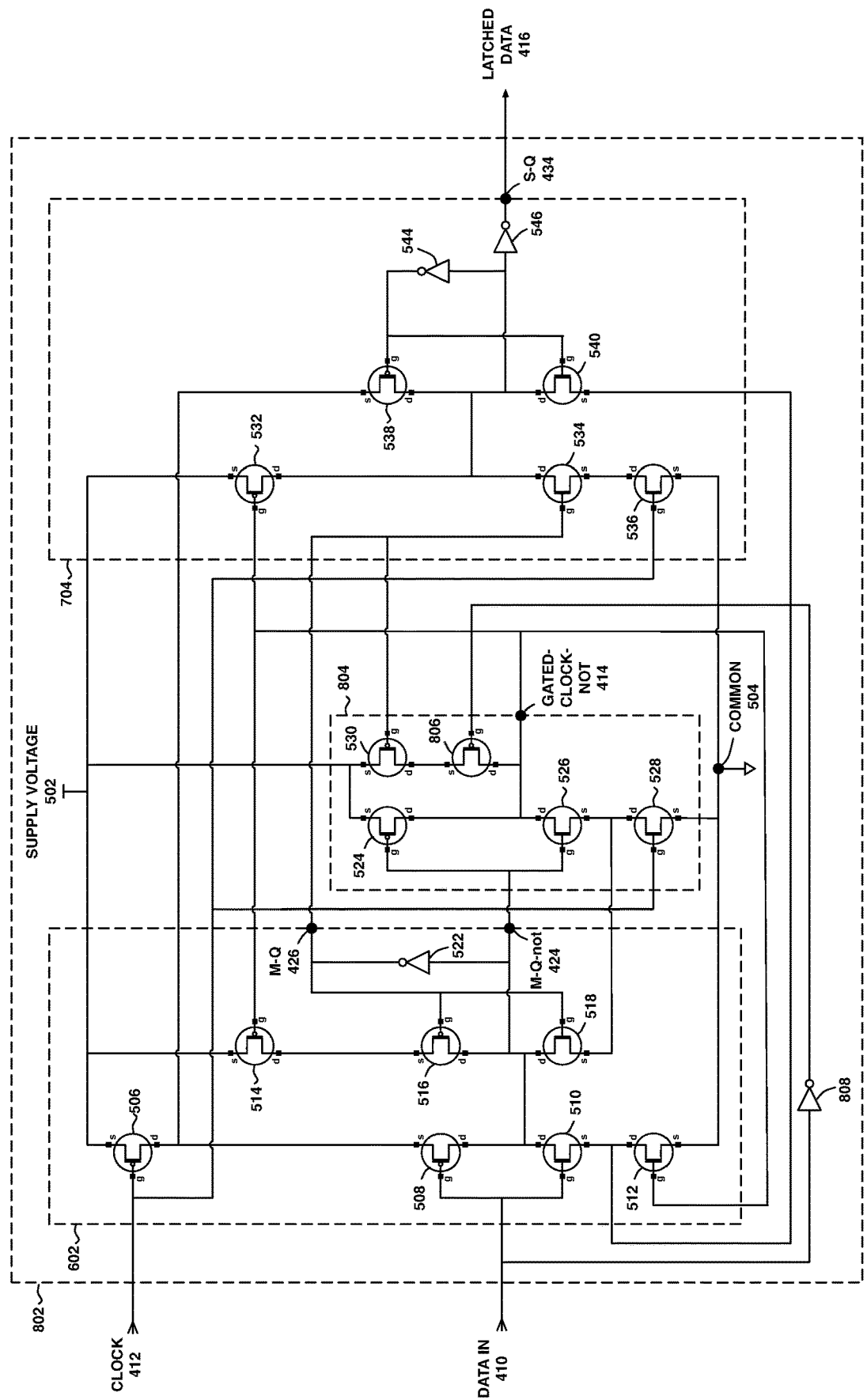
FIG. 8 is a conceptual diagram of a flip-flop element configured to implement clock inversion gating, according to one embodiment of the present invention.

FIG. 8 is a conceptual diagram of a flip-flop element 802 configured to implement clock inversion gating, according to one embodiment of the present invention. Flip-flop element 802 includes some of the same elements as flip-flop element 702 described above in conjunction with FIG. 7. However, certain additional elements have been included in flip-flop element 802 compared to flip-flop element 702. In particular, logic gate 804 includes PFET 806, as is shown. Further, flip-flop element 802 includes inverter 808.

The inclusion of PFET 806 transforms the functionality of the logic gate 804 into a two-input and-or-invert, (AOI22). Data in 410 couples to inverter 808, producing the inversion of data in 410 to drive PFET 806. Consequently, PFET 806 enables toggling of gated-clock-not 414 by the switching action of PFET 530 only when data in 410 is high.

Thus, PFET 806 prevents a series of zeroes at data in 410 from repeatedly precharging gated-clock-not 414. Reducing the number of transitions of gated-clock-not 414 further reduces the power usage of staticized master-slave flip-flop element 802.

Figure 9:
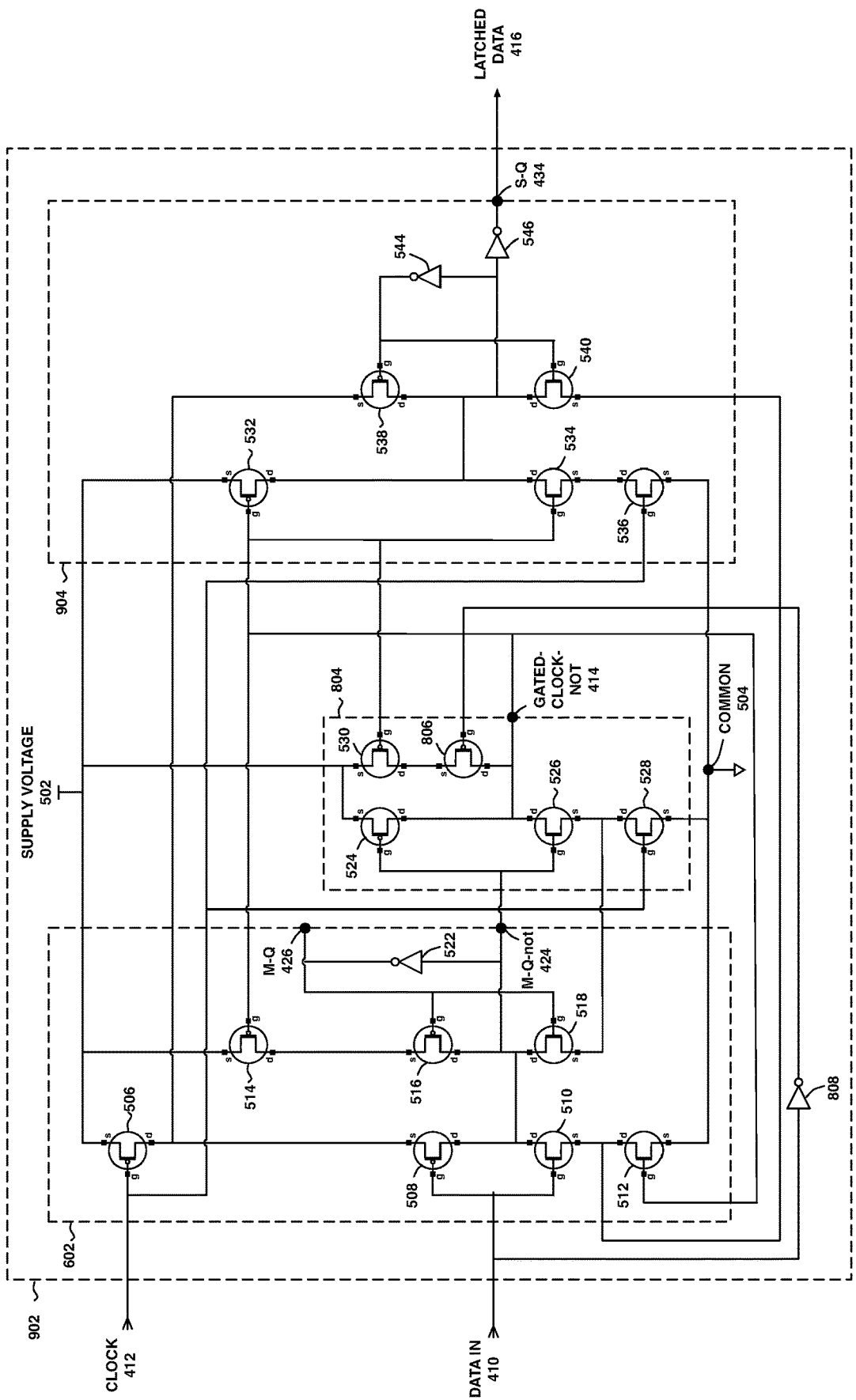
FIG. 9 is a conceptual diagram of a flip-flop element configured to minimize clocking transitions, according to one embodiment of the present invention.

FIG. 9 is a conceptual diagram of a flip-flop element 902 configured to minimize clocking transitions within a flip-flop element, according to one embodiment of the present invention. Flip-flop element 902 includes some of the same elements as flip-flop element 802 described above in conjunction with FIG. 8. However, the interconnections of certain elements have been altered in flip-flop element 902 compared to flip-flop element 802. Specifically, slave latch 904 couples the gate drive of NFET 534 to gated-clock-not 414, as is shown. Coupling the gate drive of NFET 534 to gated-clock-not 414 reduces the transitions of NFET 534 and provides further power reduction.

Figure 10:
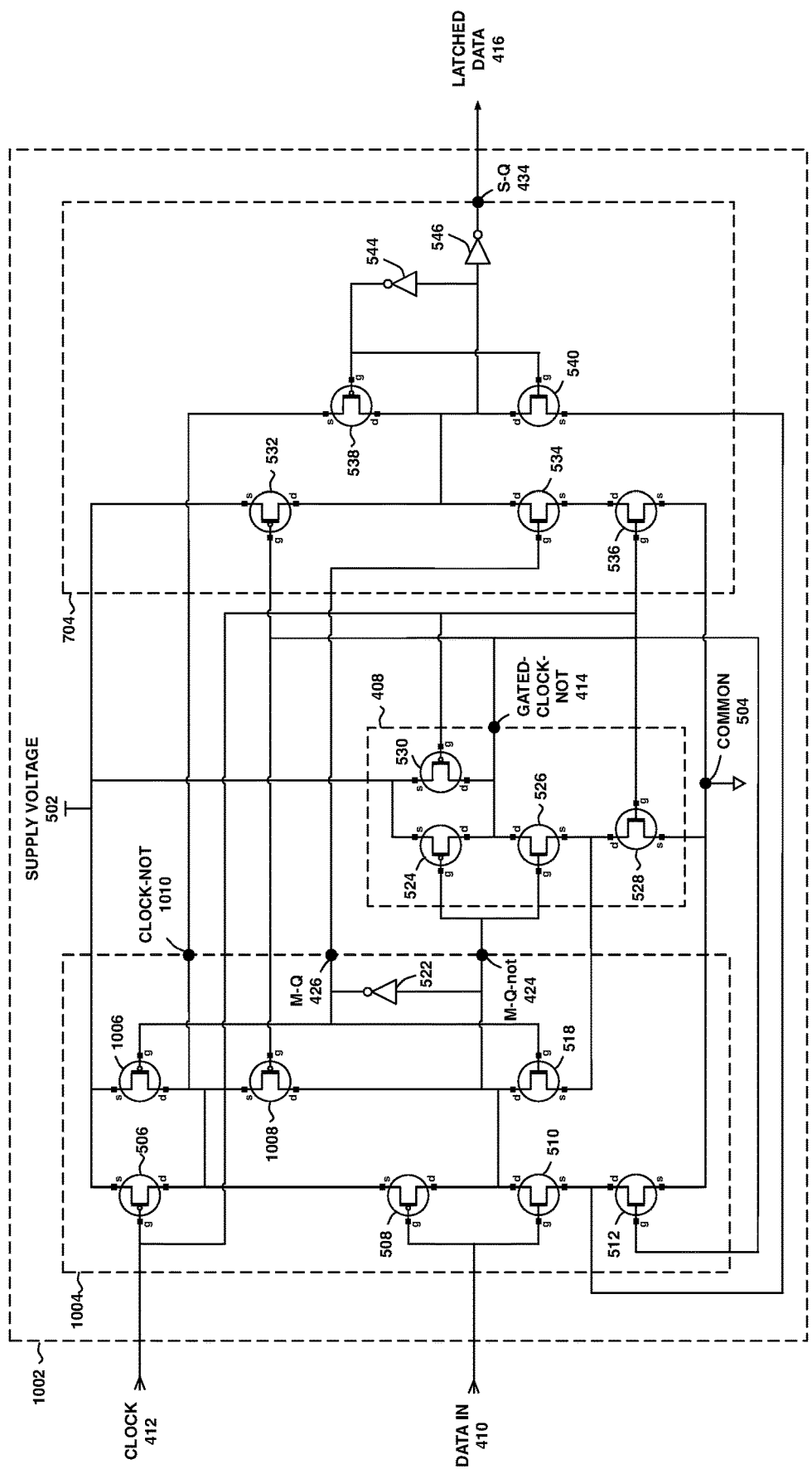
FIG. 10 is a conceptual diagram of a flip-flop element configured to implement a clean input latch, according to one embodiment of the present invention.

FIG. 10 is a conceptual diagram of a flip-flop element 1002 configured to implement a clean input latch 1004, according to one embodiment of the present invention. Flip-flop element 1002 includes some of the same elements as flip-flop element 702 described above in conjunction with FIG. 7. However, the connectivity of the input latch 1004 is configured to implement clean data capture that is significantly less susceptible to spurious transitions. Input latch 1004 receives four inputs. Specifically, the inputs to input latch 1004 are data in 410, clock 412, gated-clock-not 414, and the master true storage node M-Q 426 in a configuration known in the industry as an AND-OR-INVERT gate. PFET 1006 gates clock-not 1010, which is the inversion of the clock 412. Further, gated-clock-not connects to PFET 1008 to reduce transitions at M-Q 426.

Figure 11:
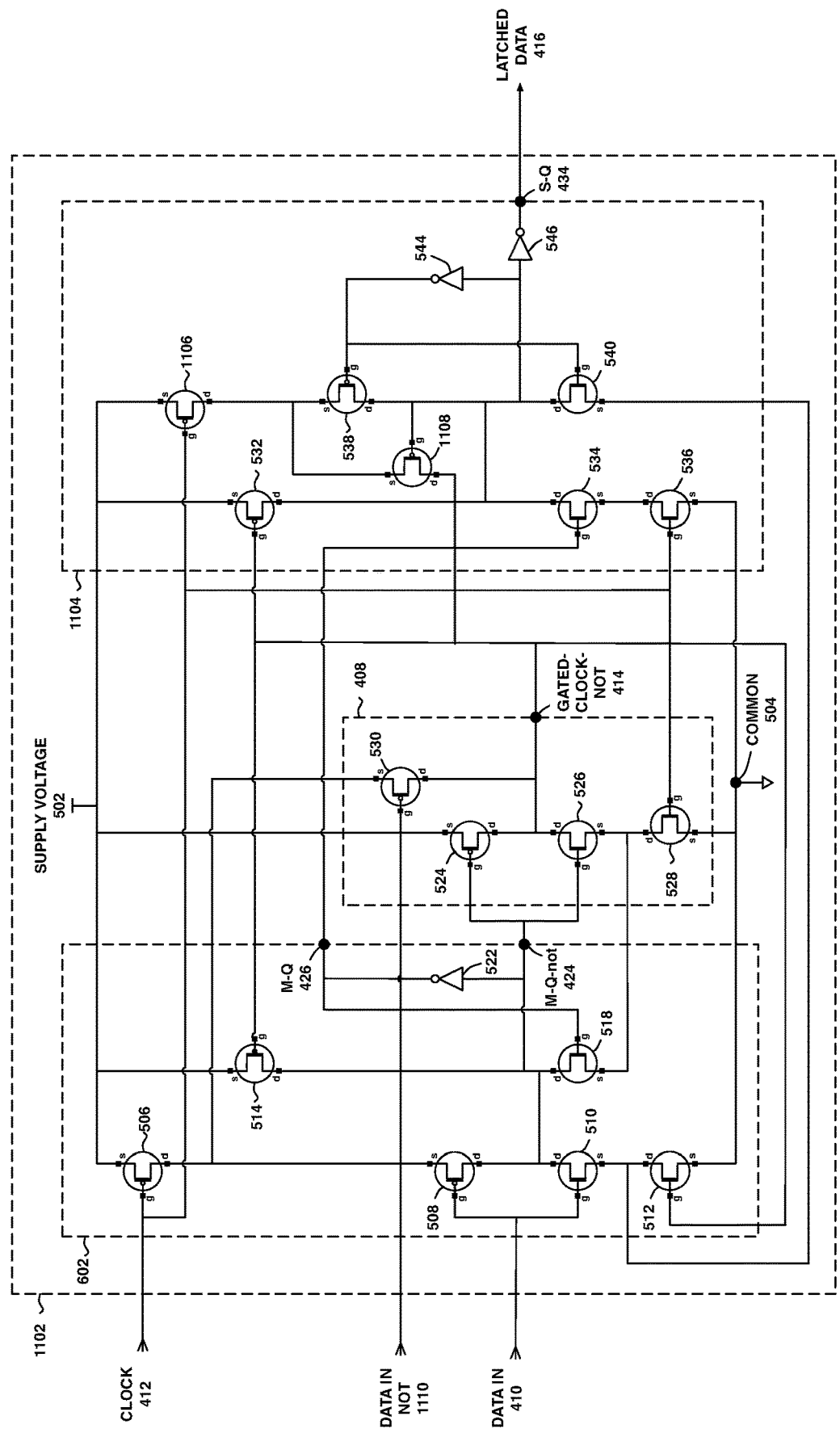
FIG. 11 is a conceptual diagram of a flip-flop element configured to implement a tristate logic element via a gated pull-up on the inverted clock, according to one embodiment of the present invention.

FIG. 11 is a conceptual diagram of a flip-flop element 1102 configured to implement a tristate logic element via a gated pull-up on the inverted clock 414, according to one embodiment of the present invention. Flip-flop element 1102 includes some of the same elements as flip-flop element 702 described above in conjunction with FIG. 7. However, PFET 1106 and PFET 1108 are included in slave latch 1104 to provide a gated pull-up that reduces unnecessary toggling of gated-clock-not 414. Further, the gate of PFET 530 is coupled to data in not 1110 to provide further immunity to spurious toggling.

In sum, a flip-flop element is configured to gate the clock inversions within a master-slave flip-flop element. The flip-flop element reduces the number of circuit elements within the flip-flop element by collapsing elements with common functionality into a single circuit element. Further, by making the actions of judiciously selected circuit elements conditional upon the state of the input data, the flip-flop element circuit reduces the number of internal transitions. In this manner, by reducing the number of circuit elements as well as the number of transitions, the flip-flop element achieves substantial reduction in overall system power consumption, resulting in a more efficient system.

One advantage of the flip-flop elements disclosed herein is that gating the clock inversion according to the state of the input data reduces the number of transitions that internal components incur. Combining elements with common functionality further reduces component count and transitions within the flip-flop element. Reducing the number of FETs and inverters within the flip-flop element and the number of internal transitions results in a substantial reduction in flip-flop element power usage.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

The invention claimed is:

1. A circuit element configured to perform a data capture operation, the circuit element comprising:
    a first latch element that:
        receives a first data signal that has a first logic state,
        inverts the first logic state to generate a second data signal that has a first inverted logic state, and
        receives a first clock signal;
    a first logic element coupled to the first latch element that:
        inverts the first clock signal to generate a first inverted clock signal based on the second data signal, and
        transmits the first inverted clock signal to the first latch element, wherein the first latch element, in response to the first inverted clock signal, inverts the first data signal to generate a first inverted data signal; and
    a second latch element comprising an input stack that receives a third data signal that has the first logic state from the first latch element, wherein the input stack comprises at least two transistors of the same type.

2. The circuit element of claim 1 wherein the first latch element comprises:
    a first inverter pair that receives the first data signal;
    a first switching element coupled between the first inverter pair and a supply voltage;
    a second switching element coupled between the first inverter pair and a grounding path;
    a second inverter pair coupled to the first inverter pair;
    a third switching element coupled between the second inverter pair and the supply voltage;
    a first inverter coupled between the first inverter pair and the second inverter pair; and
    a fourth switching element coupled between the second inverter pair and the grounding path.

3. The circuit element of claim 1, wherein the first logic element comprises:
    a first inverter pair coupled to the first latch element;
    a first switching element coupled between a node associated with the first inverter pair and a supply voltage; and
    a second switching element coupled between the first inverter pair and a grounding path.

4. The circuit element of claim 3, wherein the first logic element comprises a negated AND (NAND) gate.

5. The circuit element of claim 3, wherein the first logic element further transmits a signal based on an inversion of the first data signal to the first switching element.

6. The circuit element of claim 1, wherein the second latch element further:
  receives the third data signal from the first latch element,
  inverts the third data signal to generate a fourth data signal that has the first inverted logic state,
  receives the first clock signal,
  receives the first inverted clock signal, and
  outputs the fourth data signal in response to the first inverted clock signal.

7. The circuit element of claim 6, wherein the second latch element comprises:
  a first switching element coupled to the first latch element;
  a second switching element coupled between the first switching element and a grounding path;
  a third switching element coupled between the first switching element and a supply voltage;
  a first inverter pair coupled to the first switching element;
  a first inverter coupled to the first inverter pair; and
  a second inverter coupled to the first inverter pair.

8. The circuit element of claim 7, wherein the second latch element further comprises a fourth switching element coupled between the first inverter pair and the supply voltage.

9. The circuit element of claim 1, wherein the input stack includes an inverter with a single transistor.

10. The circuit element of claim 1, wherein the second latch element further comprises a keeper circuit that includes a transistor that is shared between the first latch element and the second latch element.

11. The circuit element of claim 1, wherein the at least two transistors comprise two N-channel metal-oxide-semiconductor (MOS) field effect transistors (FETs).

12. The circuit element of claim 1, wherein the first clock signal is applied to a gate of a first transistor included in the at least two transistors of the same type.

13. The circuit element of claim 12, wherein the first inverted clock signal is applied to a gate of a second transistor included in the second latch, and the second transistor is of a second type that is different than the first same type.

14. A flip-flop element configured to perform a data capture operation, the flip-flop element comprising:
  a first latch element that:
    receives a first data signal that has a first logic state,
    inverts the first logic state to generate a second data signal that has a first inverted logic state, and
    receives a first clock signal;
  a first logic element coupled to the first latch element that:
    inverts the first clock signal to generate a first inverted clock signal based on the second data signal, and
    transmits the first inverted clock signal to the first latch element, wherein the first latch element, in response to the first inverted clock signal,
      inverts the first data signal to generate a first inverted data signal; and
  a second latch element comprising an input stack that receives a third data signal that has the first logic state from the first latch element, wherein the input stack comprises at least two transistors of the same type.

15. The flip-flop element of claim 14, wherein the first latch element comprises:
  a first inverter pair that receives the first data signal;
  a first switching element coupled between the first inverter pair and a supply voltage;
  a second switching element coupled between the first inverter pair and a grounding path;
  a second inverter pair coupled to the first inverter pair;
  a third switching element coupled between the second inverter pair and a supply voltage;
  a first inverter coupled between the first inverter pair and the second inverter pair; and
  a fourth switching element coupled between the second inverter pair and the grounding path.

16. The flip-flop element of claim 14, wherein the first logic element comprises:
  a first inverter pair coupled to the first latch element;
  a first switching element coupled between a node associated with the first inverter pair and a supply voltage; and
  a second switching element coupled between the first inverter pair and a grounding path.

17. The flip-flop element of claim 14, wherein the second latch element further:
  receives the third data signal from the first latch element,
  inverts the third data signal to generate a fourth data signal that has the first inverted logic state,
  receives the first clock signal,
  receives the first inverted clock signal, and
  outputs the fourth data signal in response to the first inverted clock signal.

18. The flip-flop element of claim 17, wherein the second latch element comprises:
  a first switching element coupled to the first latch element;
  a second switching element coupled between the first switching element and a grounding path;
  a third switching element coupled between the first switching element and a supply voltage;
  a first inverter pair coupled to the first switching element;
  a first inverter coupled to the first inverter pair; and
  a second inverter coupled to the first inverter pair.

19. A subsystem configured to perform a data capture operation, comprising:
  a flip-flop element that:
    receives a first data signal that has a first logic state,
    inverts the first logic state to generate a second data signal that has a first inverted logic state,
    receives a first clock signal,
    inverts the first clock signal to generate a first inverted clock signal based on the second data signal,
    inverts the first data signal to produce a first inverted data signal,
    inverts the first inverted data signal to generate a third data signal that has the first logic state, and
    outputs, via an input stack comprising at least two transistors of the same type, the third data signal in response to the first inverted clock signal.

20. The subsystem of claim 19, wherein the flip-flop element includes:
  a first latch element that:
    receives the first data signal,
    inverts the first logic state to generate the first inverted logic state, and
    receives the first clock signal; and
  a first logic element that inverts the first clock signal to generate the first inverted clock signal.

21. The subsystem of claim 20, wherein the first logic element further:
  gates off the first clock signal with the first inverted logic state to generate the first inverted clock signal; and
  transmits the first inverted clock signal to the first latch element, wherein the first latch element, in response to the first inverted clock signal, inverts the first data signal to generate a first inverted data signal.

22. The subsystem of claim 21, wherein the flip-flop element includes a second latch element that:
   receives the third data signal from the first latch element;
   inverts the third data signal to generate a fourth data signal;
   receives the first clock signal;
   receives the first inverted clock signal; and
   outputs the fourth data signal in response to the first inverted clock signal.

* * * * *

UNITED STATES PATENT AND TRADEMARK OFFICE
CERTIFICATE OF CORRECTION

PATENT NO. : 10,931,266 B2
APPLICATION NO. : 14/456805
DATED : February 23, 2021
INVENTOR(S) : Ilyas Elkin et al.

Page 1 of 1

It is certified that error appears in the above-identified patent and that said Letters Patent is hereby corrected as shown below:

In the Claims

Column 13, Claim 13, Line 39, please delete "first".

Signed and Sealed this
First Day of June, 2021

Drew Hirshfeld
*Performing the Functions and Duties of the
Under Secretary of Commerce for Intellectual Property and
Director of the United States Patent and Trademark Office*